United States Patent
Wang et al.

(10) Patent No.: US 6,709,553 B2
(45) Date of Patent: Mar. 23, 2004

(54) MULTIPLE-STEP SPUTTER DEPOSITION

(75) Inventors: Wei Wang, San Jose, CA (US); Praburam Gopalraja, San Jose, CA (US); Jianming Fu, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/143,211

(22) Filed: May 9, 2002

(65) Prior Publication Data

US 2003/0209422 A1 Nov. 13, 2003

(51) Int. Cl.$^7$ .............................................. C23C 14/34
(52) U.S. Cl. ........................ 204/192.3; 204/192.12; 204/192.15; 204/192.32; 204/192.35
(58) Field of Search ................... 204/192.12, 192.15, 204/192.3, 192.32, 298.06, 298.08, 298.13, 298.31

(56) References Cited

U.S. PATENT DOCUMENTS

| | | |
|---|---|---|
| 4,863,549 A | 9/1989 | Grunwald ................... 156/345 |
| 4,999,096 A | 3/1991 | Nihei et al. ............... 204/192.3 |
| 5,830,330 A | 11/1998 | Lantsman ............... 204/192.12 |
| 5,933,753 A | 8/1999 | Simon et al. ................ 438/629 |
| 6,042,700 A | 3/2000 | Gopalraja et al. ...... 204/192.15 |
| 6,077,403 A * | 6/2000 | Kobayashi et al. ..... 204/192.12 |
| 6,080,285 A | 6/2000 | Liu et al. ................ 204/192.12 |
| 6,139,699 A | 10/2000 | Chiang et al. ......... 204/192.15 |
| 6,168,690 B1 | 1/2001 | Jewett et al. .......... 204/192.12 |
| 6,176,983 B1 | 1/2001 | Bothra et al. .......... 204/192.17 |
| 6,258,219 B1 | 7/2001 | Mueller ................. 204/192.15 |
| 6,350,353 B2 | 2/2002 | Gopalraja et al. ........ 204/192.3 |

* cited by examiner

Primary Examiner—Steven H. VerSteeg
(74) Attorney, Agent, or Firm—Moser, Patterson & Sheridan

(57) ABSTRACT

A method and apparatus for depositing a film on a substrate comprising a deposition interval wherein DC power is applied to a target to form a first plasma and material is sputtered from the target onto a substrate and, during a subsequent forming interval, high frequency power is applied to the target to remove material from at least a portion of the substrate. The sputtering working gas admitted to the chamber may be maintained at a first pressure during the deposition interval and the pressure of the sputtering working gas may be increased to a second pressure during the forming interval.

51 Claims, 3 Drawing Sheets

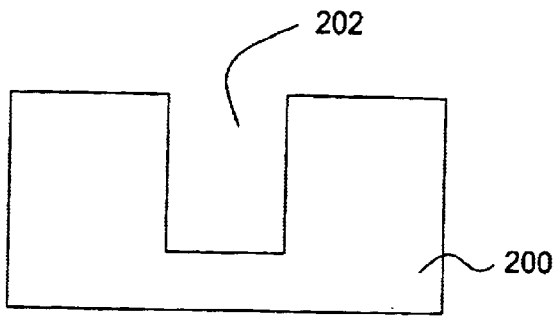
FIG. 3a
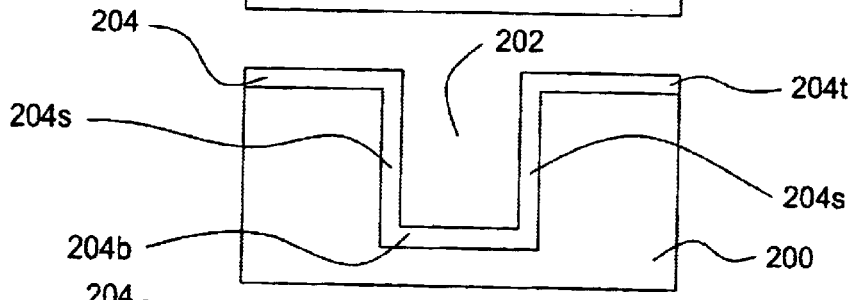
FIG. 3b
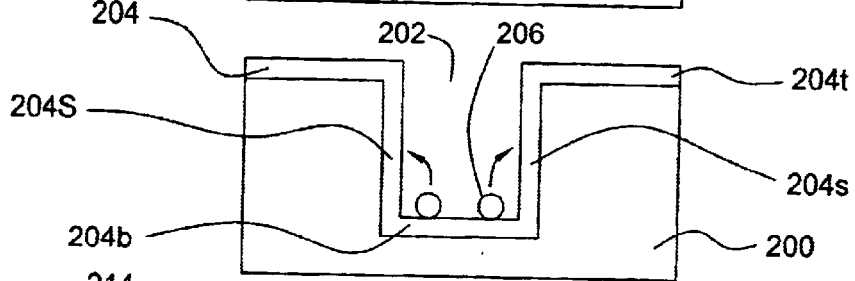
FIG. 3c
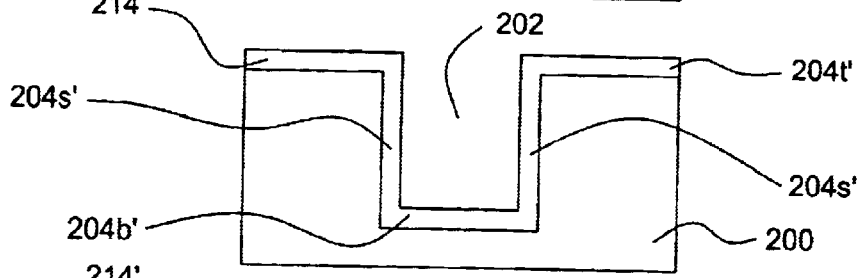
FIG. 3d
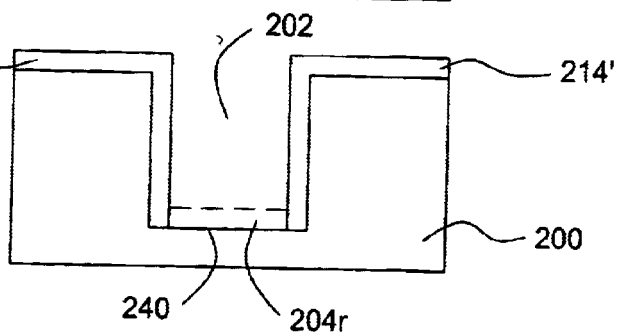
FIG. 3e
FIG. 3

MULTIPLE-STEP SPUTTER DEPOSITION

BACKGROUND OF THE DISCLOSURE

1. Field of the Invention

The present invention generally relates to sputter deposition and, more particularly, to a method and apparatus for performing a multi-step sputter-deposition process comprising a deposition interval and a forming interval.

2. Description of the Related Art

Sputtering-type physical vapor deposition, (sputter deposition or sputtering), is a thin film deposition method that, compared to many other deposition methods, utilizes relatively simple components, is comparatively inexpensive, and has high process throughput. As a result, sputtering is a desirable method for depositing thin films for applications such as integrated circuit manufacture.

As the feature sizes in integrated circuits become smaller, the demands placed on sputter deposition increases significantly, particularly with respect to film uniformity and step coverage. For example, the current generation of integrated circuits requires high-aspect ratio features with dimensions less than about one quarter of a micron.

Conventional sputtering processes sputter deposit material across a wide angular distribution that typically has a cosine dependence about the target. Such a wide distribution is disadvantageous for filling a high aspect ratio structure. This is because the material that is sputtered from the target in a direction that is not nearly perpendicular to the substrate (i.e., the off-angle portion of the sputtering distribution), preferentially deposits around the upper corners of the high aspect ratio structure forming overhangs. Large overhangs on the high aspect ratio structures restrict the deposition of barrier material therein and at a minimum cause inadequate coverage or substantial thickness variations along the sidewalls and bottom surfaces thereof. While there are a number of techniques used in the art to improve step coverage in PVD processes that are used to deposit material in high aspect ratio features, each technique has its drawbacks.

Therefore, a need exists for a method and apparatus for sputter depositing material into high aspect ratio features such that the sputtered film has a high degree of step coverage and uniformity.

SUMMARY OF THE INVENTION

Embodiments of the present invention generally provide a method and apparatus for sputter depositing a film on a substrate. The method comprises, in a deposition interval, applying DC power to a target within a chamber and using a sputtering working gas to sputter material from the target onto the substrate. In a forming interval, that follows the deposition interval, the DC power applied to the target is disconnected and a high frequency power is applied to the target.

During the deposition interval, a sputtering working gas admitted to the chamber has a first pressure. The DC power is applied to the chamber, igniting the working gas to form a plasma. The sputtering working gas sputters material from the target onto the substrate and forms an intermediate layer thereon. During the forming interval, the pressure of the sputtering working gas is increased to a second pressure. A high frequency power is applied to the target to form a plasma that will sputter material from the bottom of a feature on the substrate. As this material is sputtered from the bottom of the feature, the material may be redeposited on a sidewall of the feature. To enhance the ability of the plasma to remove material from the feature on the substrate, a bias power may be applied to a wafer support pedestal during the forming interval.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 3A–3E depict cross-sectional views of a substrate at different stages of a sputter deposition sequence.

DETAILED DESCRIPTION

Figure 1:
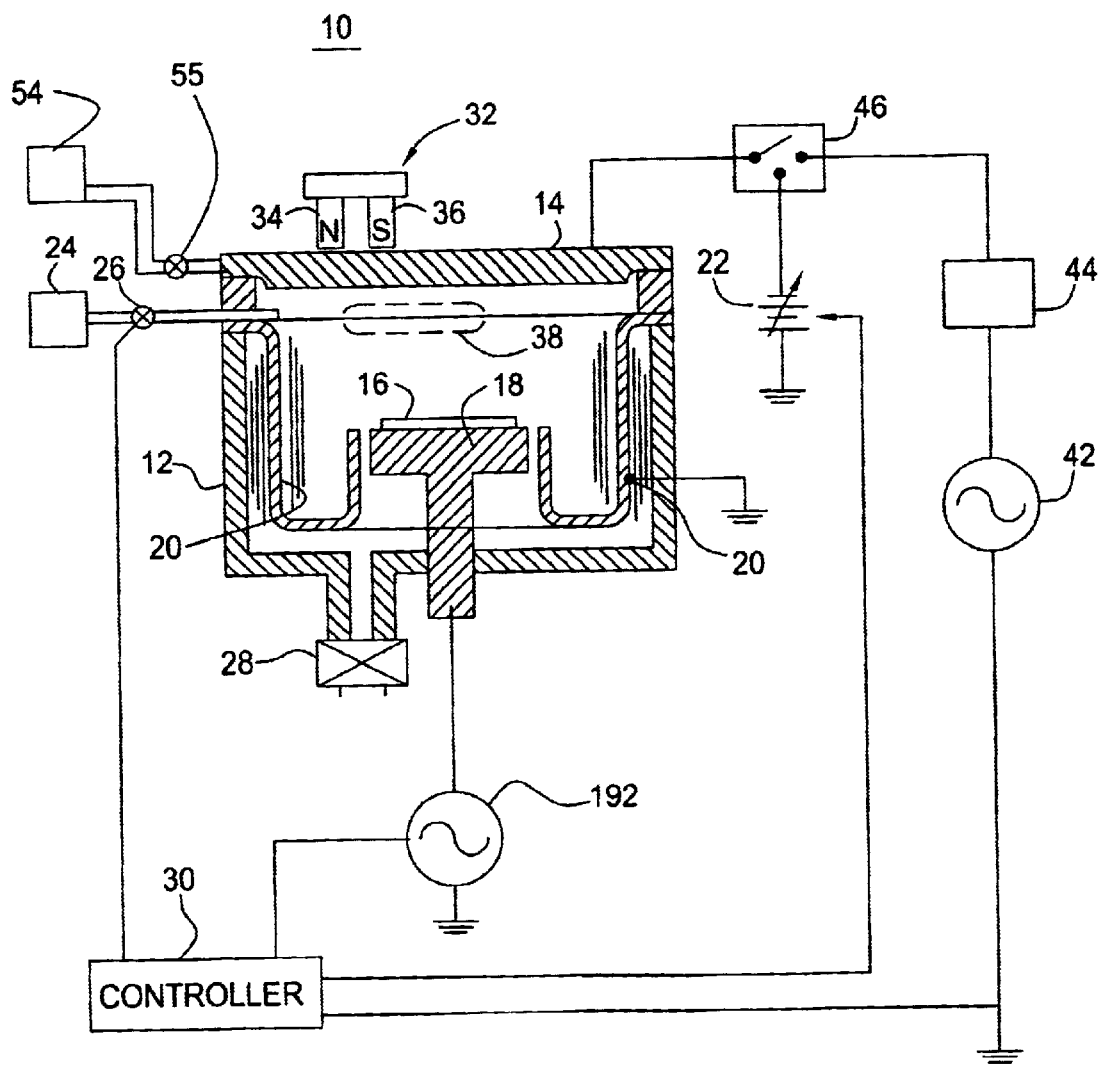
FIG. 1 is a schematic cross-sectional view of a process chamber that can be used for the practice of embodiments of the invention described herein.

FIG. 1 depicts a schematic, cross-sectional view of a sputtering-type physical vapor deposition (PVD) reactor 10 that can be used to practice embodiments of the invention described herein. The reactor 10 includes a vacuum chamber 12 sealed to a target 14. The target 14 comprises a material to be sputter deposited on a substrate 16. The substrate 16 is supported in the chamber 12 by a heated pedestal 18. The target 14 may comprise, for example, tantalum, tungsten, titanium, aluminum, copper, among other materials. The substrate 16 may be, for example, a wafer, such as a silicon wafer. A shield 20 held within the chamber protects the chamber wall 12 from the sputtered material and provides the anode ground plane. A DC power supply 22 is coupled to the target 14 to apply a negative voltage to the target 14. The DC power supply 22 may be configured to supply pulsed power or continuous power. The pedestal 18 and hence the substrate 16 may be left electrically floating.

Also coupled to target 14 is a high frequency power supply 42 such as a microwave or an RF power supply. The high frequency power supply 42 generally has a frequency of between about 400 kHz to about 500 MHz, or, in one embodiment, about 13.56 MHz. The high frequency power supply 42 may be configured to supply pulsed power or continuous power. An impedance matching network 44 is coupled to the power supply 42 in order to insure maximum power transmission to the plasma.

Both the DC power supply 22 and the high frequency power supply 42 are coupled to a device for coupling either the DC power or the high frequency power to the target 14. The device, in one embodiment, is a switch 46. The switch 46 selects power from either the DC power supply 22 or power from the high frequency power supply 42 to be coupled to the target 14. In other embodiments, the device could be a mere coupling and the respective power supplies could be activated and deactivated to facilitate "switching". Those skilled in the art will realize that there are many ways to switch DC and RF power that would function to fulfill the intention of the invention. Furthermore, in some embodiments, it may be advantageous to have both DC and RF power coupled to the target simultaneously. As such, it is contemplated that the device include such circuits to facilitate simultaneous coupling of RF and DC to the target.

A first gas source 24 supplies a sputtering working gas, typically an inert gas, such as argon (Ar), helium (He), xenon (Xe), among others, to the chamber 12 through a mass flow controller 26. A second gas source 54 supplies a reactive gas, such as nitrogen (N) to the chamber 12 through a mass flow controller 55. The gases may be admitted to the top of the chamber, as illustrated, or at its bottom, either with one or more inlet pipes penetrating the bottom of the shield 20 or through the gap between the shield 20 and the pedestal 18. A vacuum system 28 maintains the chamber at a low pressure. Although the base pressure can be held to about $10^{-7}$ torr or lower, the pressure of the sputtering working gas is typically maintained at between about 0.2 millitorr and about 100 millitorr.

To provide efficient sputtering, a magnetron 32 is generally positioned behind the target 14. The magnetron 32 has opposed magnets 34, 36 creating a magnetic field within the chamber in the neighborhood of the magnets 34, 36. The magnetic field confines electrons and, for charge neutrality, the ion density also increases to form a high-density plasma region 38 within the chamber adjacent to the magnetron 32. The area of the magnetron 32 is variable and may be adjusted to control the degree of ionization in the plasma, The magnetron 32 is usually rotated about the center of the target 14 to achieve full coverage in sputtering of the target 14.

The magnetron 32 may have any number of shapes, such as, an oval, a triangle, a racetrack, a circle, a teardrop, etc. The magnetron 32 may have an inner pole and an outer pole (not shown). The inner pole may be surrounded by a continuous outer pole. In one embodiment, the magnet may have an unbalanced design, i.e., the magnetic flux of the outer pole may be greater than the magnetic flux produced by the inner pole. Details of the magnetron 32 are described in commonly assigned U.S. Pat. No. 6,290,825, entitled, "High-Density Plasma Source For Ionized Metal Deposition", issued on Sep. 18, 2001, and is hereby incorporated by reference.

A bias power supply 192, such as an RF power supply, is also coupled to the pedestal 18 for biasing the substrate 16, in order to control the deposition of the sputter deposited layer on the substrate 16. The bias power is typically a high frequency source, having a frequency of, for example, 13.56 MHz, or between about 400 kHz to about 500 MHz. The bias power supply 192 may, for example, provide bias power at a frequency similar to the frequency of power supplied by the high frequency power supply 42.

A microprocessor controller 30 controls the reactor including the DC power supply 22, the high frequency power supply 42, the bias power supply 192, the mass flow controller 26, and the mass flow controller 55. The controller 30 may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored on the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Thin Film Deposition

Figure 2:
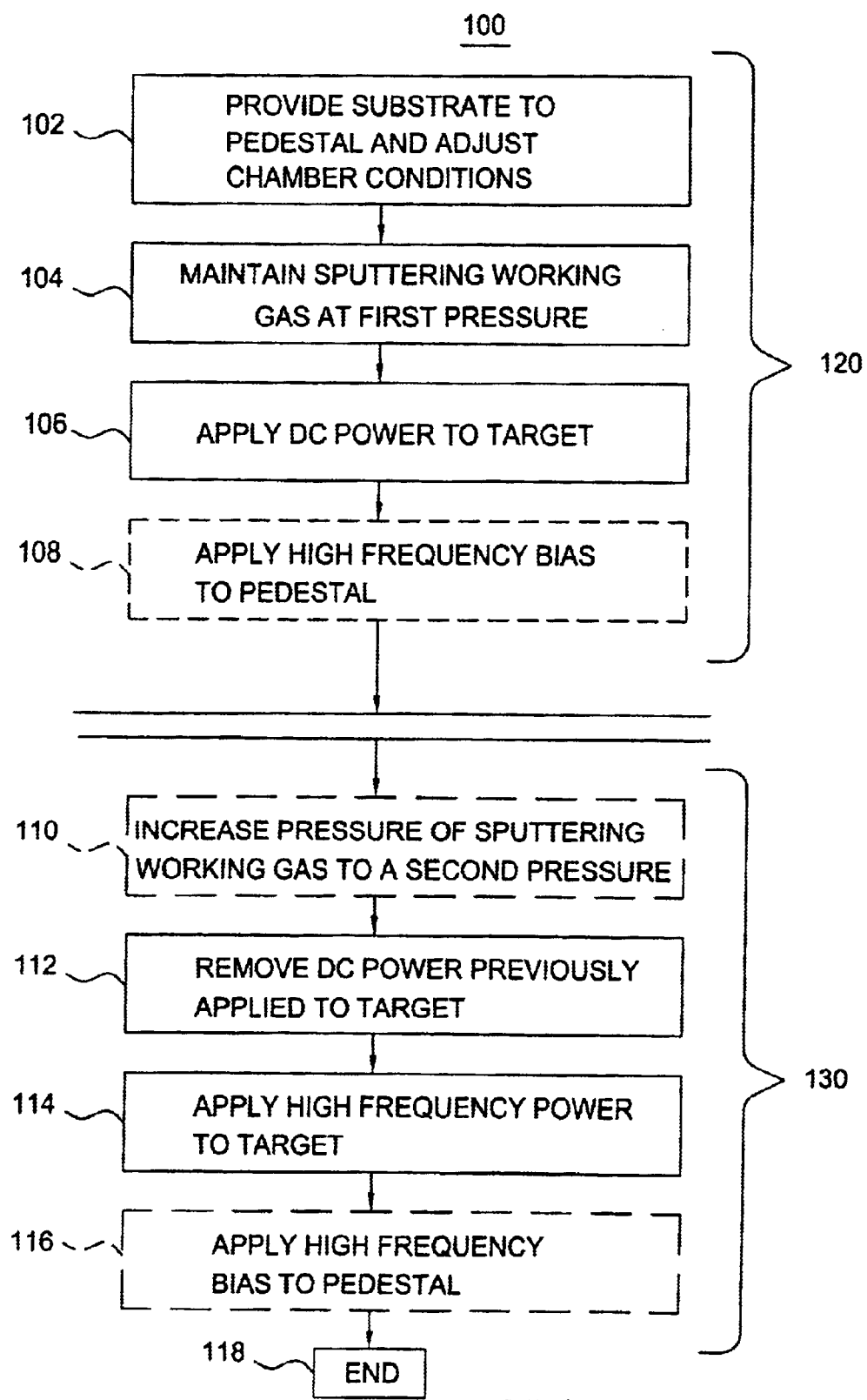
FIG. 2 illustrates a process flow sequence for film deposition using embodiments of the invention described herein.

FIG. 2 illustrates an exemplary process sequence 100 detailing various steps used for film deposition according to embodiments of the invention described herein. These steps may be performed, for example, using a sputtering reactor similar to the reactor 10 described above with reference to FIG. 1. As shown in step 102, a substrate is provided to the pedestal 18 within the chamber 12. The sputtering working gas is admitted to the chamber 12, and is maintained at a first pressure, as indicated in step 104. The first pressure may be, for example, less than about 2 millitorr.

During a deposition interval 120, as shown in step 106, DC power is applied to the target 14 using the DC power supply 22. The DC power may be applied between the target 14 and, for example, the shield 20, and the sputtering working gas is thereby ignited into a plasma. The DC power may be in a range of about 5 kilowatts (kW) to about 40 kilowatts (kW). In one specific embodiment, the DC power may be in the range of about 20 kilowatts (kW) to about 24 kW. Positively charged sputtering working gas ions are attracted to the negatively charged target 14. The ions of sputtering working gas strike the target 14 at a substantial energy and cause target atoms or atomic clusters to be sputtered from the target 14. A magnetic field such as a magnetic field generated from a magnetron may confine material sputtered from the target 14 within a region such as the high density plasma region 38. The composition of the plasma is dominated by ions of material sputtered from the target 14 rather than by ions of sputtering working gas. During the deposition interval 120, the sputtering working gas may have a flow rate in a range of about 1 sccm to about 100 sccm . The chamber 12 may be maintained in a temperature range of about 20 degrees Celsius to about 200 degrees Celsius and a pressure of less than 2 m Torr. The deposition interval 120 may have a duration in the range of about 1 second to about 100 seconds.

As indicated in step 108, a high frequency bias, such as an RF bias is optionally applied to the pedestal 18 using the bias power supply 192 to enhance film deposition. The bias may have a power in the range of about 100 Watts to about 5 kW. The bias power causes the substrate 16 to accumulate a negative potential that attracts ionized sputtered material towards the substrate 16.

During a forming interval 130, according to step 110, the pressure of the sputtering working gas may be increased to a second pressure that is greater than the first pressure described with reference to the deposition interval 120. The second pressure may be in the range of about 10 millitorr to about 100 millitorr. In one specific embodiment, the pressure of the sputtering working gas is maintained in a range of about 20 millitorr to about 30 millitorr.

The forming interval 130 comprises removing the DC power that was applied to the target during the deposition interval 120, as indicated in step 112. As indicated in step 114, the power to the target 14 is switched using the switch 46 to remove the DC power from the target 14 and to apply a high frequency power, such as an RF power, to the target 14, using high frequency power supply 42. In one embodiment, the high frequency power is in the range of about 1 kW to about 10 kW. The composition of the plasma then becomes dominated by sputtering working gas ions rather than ions of the material sputtered from target 14. The density of sputtering working gas ions may be in the range of about $10^9$ ions per cubic centimeter to about $10^{11}$ ions per cubic centimeter. During the forming interval 130, the sputtering working gas may have a flow rate in a range of about 10 sccm to about 200 sccm.

As shown in step 116, the forming interval 130 may further comprise applying a bias power, such as an RF bias power, to the pedestal 18, using bias power supply 192. The bias power applied to the pedestal 18 may be in the range of about 100 watts (W) to about 1500 W. When the bias power is applied to the substrate, a negative DC potential is created (due to electron accumulation) on the substrate 16. The negative potential at the substrate 16 attracts ionized sputtering working gas. The sputtering working gas is generally attracted to the substrate in a direction that is substantially orthogonal to the substrate. The method ends with step 118.

During the forming interval 130, the plasma removes material that has been deposited on, for example, a horizontal surface, during the deposition interval. By limiting the power applied to the target 14 and using high frequency AC power during the forming interval, sputtering of the target 14 is minimized. The inventive combination of the deposition interval 120 and the forming interval 130 can be conveniently conducted in the same chamber 12. Application of the high frequency power to the target 14 may also provide the additional benefit of aiding in the removal of undesirable compounds such as, for example, nitrides from the target 14. The forming interval 130 may have a duration in a range of about 1 second to about 100 seconds. During the forming interval 130, the chamber 12 may be maintained in a temperature range of about 20 degrees Celsius to about 100 degrees Celsius. The sputtering working gas may have a flow rate in the range of about 10 sccm to about 200 sccm.

In one embodiment, the deposition interval 120 and the forming interval 130 are sequential and non-overlapping time intervals, i.e., the deposition interval is followed by the forming interval. Alternatively, the deposition interval 120 and the forming interval 130 may be partially overlapping time intervals and not mutually exclusive, i.e., one or more events described above as occurring within the deposition interval may take place within the forming, interval as well. Similarly, one or more events described above as occurring within the forming interval may take place within the deposition interval as well.

FIGS. 3A–3E depict cross-sectional views of a substrate 200 at different stages of the process sequence 100 depicted in FIG. 2. The substrate 200, shown in FIG. 3a, refers to any workpiece on which film processing is performed. Depending on the specific stage of processing, the substrate 200 may be a silicon wafer, or include other material layers that have been formed on the substrate 200. The substrate 200 has a feature 202, such as a trench or via, formed thereon.

Referring to FIGS. 2 and 3, the DC power is applied to the target 14 during the deposition interval 120 using a DC power supply 22, and the sputtering working gas is thereby ignited into a plasma. Positively charged sputtering working gas ions are attracted to the negatively charged target 14. Some of the sputtered target particles strike the substrate 200 and are thereby deposited on it, forming an intermediate layer 204 of the target material, as indicated in FIG. 3b. The intermediate layer 204 is intermediate in a sense that the intermediate layer 204 undergoes additional processing during the forming interval 130 to achieve a final layer.

The intermediate layer 204 that is sputtered onto the substrate 200 includes the vertical sidewalls 204s, a bottom region 204b, and a field 204t. The thickness of the vertical sidewalls 204s may be less than the thickness of the bottom region 204b. The thickness of the vertical sidewalls 204s may be less than the thickness of the field 204t.

During the forming interval 130, the DC power that was applied to the target during the deposition interval 120 is removed, the switch 46 is switched, and a high frequency bias, is then applied to the target 14. Ions of the sputtering working gas are directed to the intermediate layer 204. The high frequency bias applied to the pedestal during the forming interval 130 helps to direct sputtering working gas ions into the feature 202 formed on the substrate 200 and, in particular, to the bottom region 204b of the intermediate layer 204.

The sputtering working gas ions cause particles 206 from the intermediate layer 204 to be sputtered therefrom. Referring to FIG. 3c, particles from the bottom region 204b in particular are sputtered and may redeposit on, for example, the sidewalls 204s.

As indicated in FIG. 3d, the sputtering of particles 206 from the bottom region 204b to the sidewalls 204s during the forming interval 130 results in the formation of a final film 214. The final film 214 includes vertical sidewalls 204s', a bottom region 204b', and a field 204t'. The thickness of the sidewalls 204s' may be greater than the thickness of the sidewalls 204s. The thickness of the bottom region 204b' is less than the thickness of the bottom region 204b'. Furthermore, the difference in thickness between the sidewalls 204s and the bottom region 204b that existed prior to the forming interval 130 may be reduced by sputtering particles 206 from the bottom region 204b.

In one embodiment, as illustrated in FIG. 3e, the forming interval 130 may continue to a point at which a portion 204r of the final film 214' is completely removed to expose a bottom portion 240 of the feature.

The sequence comprising the deposition interval 120, followed by the forming interval 130, as discussed above may be repeated one or more times to deposit a final film 214 having, for example, a predetermined thickness.

Embodiments of the present invention may be practiced for reactive sputtering, such as for tantalum nitride (TaN). In this embodiment, during the deposition interval 120, a reactive gas such as nitrogen is admitted to the chamber with the sputtering working gas and the target is sputtered in an atmosphere comprising the reactive gas during the deposition interval 120. The reactive gas may also be supplied to the chamber during the forming interval. In the example of forming a tantalum nitride layer, nitrogen reacts with tantalum atoms sputtered from the target to form tantalum nitride on the substrate.

One exemplary process of depositing a tantalum nitride layer comprises, in a deposition interval, admitting argon to the chamber 12, applying a DC power of about 20 kW to the target 14, and igniting the argon into a plasma. The argon sputters tantalum from the target 14. Argon is supplied to the chamber 12 at a flow rate of about 10 sccm and nitrogen is supplied to the chamber 12 at a flow rate of about 40 sccm. In a forming interval, that follows the deposition interval, the DC power applied to the target is disconnected and RF power of about 5 kilowatts is applied to the target. The RF power applied to the target 14 forms a plasma that "sputter deposits" material from the bottom of a feature on the substrate. The total time of the deposition interval and the forming interval is about five seconds, and a tantalum nitride film having a thickness of about 100 Angstroms is formed.

In an extension of the exemplary process discussed above, a tantalum film is deposited on the tantalum nitride layer. The process comprises admitting argon to the chamber 12 and applying a DC power of about 20 kW to the target 14, and igniting the argon into a plasma. The argon sputters tantalum from the target 14. Argon is supplied to the chamber 12 at a flow rate of about 10 sccm. In a forming interval, that follows the deposition interval, the DC power applied to the target is disconnected and RF power of about 5 kilowatts is applied to the target. The RF power applied to the target 14 forms a plasma that sputter deposits material from the bottom of a feature on the substrate. The total time of the deposition interval and the forming interval is about ten seconds, and a tantalum nitride film having a thickness of about 150 Angstroms is formed on top of the tantalum nitride film discussed above.

While foregoing is directed to the preferred embodiment of the present invention, other and further embodiments of the invention may be devised without departing from the basic scope thereof, and the scope thereof is determined by the claims that follow.

What is claimed is:

1. A method of depositing a film on a substrate in a physical vapor deposition chamber, comprising:
   during a deposition interval, applying DC power to a target to form a first plasma from a sputtering working gas, and sputtering material from the target onto the substrate; and
   during a forming interval, removing the DC power applied to the target and applying high frequency power to the target to form a second plasma of the sputtering working gas to remove material from at least a portion of the substrate.

2. The method of claim 1 wherein the high frequency power applied to the target is radio frequency power.

3. The method of claim 2 wherein the high frequency power applied to the target has a frequency in a range of about 400 kilohertz (kHz) and about 500 megahertz (MHz).

4. The method of claim 1 wherein the high frequency power applied to the target is in the range of about 1 kilowatts to about 10 kilowatts.

5. The method of claim 1 wherein the deposition interval further comprises providing to the chamber the sputtering working gas having a first pressure, and the forming interval further comprises providing to the chamber the sputtering working gas having a second pressure wherein the second pressure is greater than the first pressure.

6. The method of claim 5 wherein the first pressure is less than about 2 millitorr.

7. The method of claim 5 wherein the second pressure is in the range of about 10 millitorr to about 100 millitorr.

8. The method of claim 1 wherein the substrate is retained on a pedestal, and the deposition interval further comprises applying a first high frequency bias power to the pedestal.

9. The method of claim 8 wherein the first high frequency bias power applied to the pedestal has a power in the range of about 100 watts (W) to about 5 kilowatts (kW).

10. The method of claim 1 wherein the substrate is retained on a pedestal, and the forming interval further comprises applying a second high frequency bias power to the pedestal.

11. The method of claim 10 wherein the second high frequency bias applied to the pedestal has a power in the range of about 100 watts (W) to about 500 watts (W).

12. The method of claim 1 wherein the sputtering working gas is selected from the group consisting of argon (Ar), helium (He), xenon (Xe), and combinations thereof.

13. The method of claim 1 wherein the target comprises a material selected from the group consisting of tantalum, titanium, tungsten, copper, aluminum and combinations thereof.

14. The method of claim 1 wherein the sputtering in an interval selected from the group consisting of the deposition interval, the forming interval, and combinations thereof, is performed in an atmosphere comprising a reactive gas.

15. A method of depositing a film on a substrate having a feature formed thereon, comprising:
   during a deposition interval, applying DC power to a target to form a first plasma from a sputtering working gas, and using the sputtering working gas to sputter material from the target onto the substrate to form an intermediate layer thereon, wherein the sputtering working gas has a first pressure; and
   during a forming interval, removing the DC power, applying high frequency power to the target to form a second plasma of the sputtering working gas, and using the sputtering working gas to sputter material from the intermediate layer, wherein the sputtering working gas has a second pressure, and wherein the second pressure is greater than the first pressure.

16. The method of claim 15 wherein the forming interval comprises sputtering material from a horizontal surface of the intermediate layer onto a vertical surface of the intermediate layer.

17. The method of claim 15 wherein the high frequency power applied to the target is a radio frequency power.

18. The method of claim 15 wherein the high frequency power applied to the target has a frequency in a range of about 400 kilohertz (kHz) and about 500 megahertz (MHz).

19. The method of claim 15 wherein the high frequency power applied to the target is in the range of about 1 kW to about 10 kW.

20. The method of claim 15 wherein the first pressure is less than about 2 millitorr.

21. The method of claim 15 wherein the second pressure is in the range of about 10 millitorr to about 100 millitorr.

22. The method of claim 15 wherein the substrate is held on a pedestal, and the deposition interval further comprises applying a first high frequency bias to the pedestal.

23. The method of claim 22 wherein the first high frequency bias applied to the pedestal is in the range of about 100 watts (W) to about 5 kW.

24. The method of claim 15 wherein the substrate is held on a pedestal, and the forming interval further comprises applying a second high frequency bias to the pedestal.

25. The method of claim 24 wherein the second high frequency bias applied to the pedestal has a power in the range of about 100 Watts (W) to about 1500 W.

26. The method of claim 15 wherein the sputtering working gas is selected from the group consisting of argon (Ar), helium (He), xenon (Xe), and combinations thereof.

27. The method of claim 15 wherein the target comprises a material selected from the group consisting of tantalum, titanium, tungsten, copper, aluminum and combinations thereof.

28. The method of claim 15 wherein the sputtering in an interval selected from the group consisting of the deposition interval, the forming interval, and combinations thereof,is performed in an atmosphere comprising a reactive gas.

29. A method of depositing a film on a substrate in a physical vapor deposition chamber, comprising:

during a deposition interval, applying DC power to a target to form a first plasma from a sputtering working gas, and sputtering material from the target onto the substrate, wherein the sputtering working gas has a first pressure; and during a forming interval, removing the DC power applied to the target and applying radio frequency (RF) power to the target to form a second plasma of the sputtering working gas to remove material from at least a portion of the substrate, wherein the radio frequency power is in the range of about 1 kilowatts (kW) to about 10 kilowatts (kW), and wherein the sputtering working gas has a second pressure that is greater than the first pressure.

30. The method of claim 29 wherein the radio frequency power applied to the target has a frequency in a range of about 400 kilohertz (kHz) and about 500 megahertz (MHz).

31. The method of claim 29 wherein the first pressure is less than about 2 millitorr.

32. The method of claim 29 wherein the second pressure is in the range of about 10 millitorr to about 100 millitorr.

33. The method of claim 29 wherein the substrate is held on a pedestal, and the deposition interval further comprises applying a first high frequency bias power to the pedestal.

34. The method of claim 33 wherein the first high frequency bias power applied to the pedestal has a power in the range of about 100 watts (W) to about 5 kW.

35. The method of claim 29 wherein the substrate is held on a pedestal, and the forming interval further comprises applying a second high frequency bias power to the pedestal.

36. The method of claim 35 wherein the second high frequency bias applied to the pedestal has a power in the range of about 100 Watts (W) to about 1600 W.

37. The method of claim 29 wherein the sputtering working gas is selected from the group consisting of argon (Ar), helium (He), xenon (Xe), and combinations thereof.

38. The method of claim 29 wherein the target comprises a material selected from the group consisting of tantalum, titanium, tungsten, copper, aluminum and combinations thereof.

39. The method of claim 29 wherein the sputtering in an interval selected from the group consisting of the deposition interval, the forming interval, and combinations thereof, is performed in an atmosphere comprising a reactive gas.

40. The method of claim 29 wherein the deposition interval and the forming interval are non-overlapping intervals.

41. The method of claim 29 wherein the deposition interval has a duration in a range in a range of about 1 second to about 100 seconds.

42. The method of claim 29 wherein the forming interval has a duration in a range of about 1 second to about 100 seconds.

43. The method of claim 29 further comprising sequentially repeating the deposition interval and the forming interval.

44. A method of depositing a film on a substrate in a physical vapor deposition chamber, comprising:

during a deposition interval having a duration from about 1 second to about 100 seconds, applying DC power in a range of about 5 kilowatts to about 40 kilowatts to a target to form a first plasma from an inert sputtering working gas, and sputtering material from the target onto the substrate to form an intermediate layer thereon, wherein the inert sputtering working gas has a first pressure less than about 2 millitorr; and during a forming interval having a duration from about 1 second to about 100 seconds that is non-overlapping with the deposition interval, removing the DC power applied to the target and applying a radio frequency (RF) power in a range of about 1 kilowatts (kW) to about 10 kilowatts (kW) to the target to form a second plasma of the sputtering working gas, the sputtering working gas having a second pressure in a range of about 10 millitorr to about 100 millitorr, sputtering material from a horizontal surface of the intermediate layer, and applying a radio frequency bias in a range of about 100 watts to about 1500 watts to a substrate support pedestal.

45. The method of claim 44 wherein the high frequency power applied to the target has a frequency in a range of about 400 kilohertz (kHz) and about 500 megahertz (MHz).

46. The method of claim 44 wherein the deposition interval further comprises applying a high frequency bias power to the pedestal.

47. The method of claim 46 wherein the high frequency bias power applied to the pedestal has a power in the range of about 100 watts (W) to about 5 kW.

48. The method of claim 44 wherein the inert sputtering working gas is selected from the group consisting of argon (Ar), helium (He), xenon (Xe), and combinations thereof.

49. The method of claim 44 wherein the target comprises a material selected from the group consisting of tantalum, titanium, tungsten, copper, aluminum and combinations thereof.

50. The method of claim 44 wherein the sputtering in an interval selected from the group consisting of the deposition interval, the forming interval, and combinations thereof, is performed in an atmosphere comprising a reactive gas.

51. The method of claim 44 further comprising sequentially repeating the deposition interval and the forming interval.

* * * * *

UNITED STATES PATENT AND TRADEMARK OFFICE
CERTIFICATE OF CORRECTION

PATENT NO. : 6,709,553 B2
DATED : March 23, 2004
INVENTOR(S) : Wei Wang, Praburam Gopalraja and Jianming Fu It is certified that error appears in the above-identified patent and that said Letters Patent is hereby corrected as shown below:

Column 7,
Line 67, please change "500 watts" to -- 1500 watts --.

Column 9,
Line 33, please change "1600 watts" to -- 1500 watts --.

Signed and Sealed this

Fourteenth Day of December, 2004

JON W. DUDAS
*Director of the United States Patent and Trademark Office*